US009635761B2

(12) United States Patent
Brigham et al.

(10) Patent No.: US 9,635,761 B2
(45) Date of Patent: Apr. 25, 2017

(54) SLEEVED COAXIAL PRINTED CIRCUIT BOARD VIAS

(71) Applicant: Massachusetts Institute of Technology, Cambridge, MA (US)

(72) Inventors: Glenn A. Brigham, Chelmsford, MA (US); Richard J. Stanley, Moultonborough, NH (US); Bradley Thomas Perry, Nashua, NH (US); Patrick J. Bell, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/306,768

(22) Filed: Jun. 17, 2014

(65) Prior Publication Data

US 2015/0014045 A1 Jan. 15, 2015

Related U.S. Application Data

(60) Provisional application No. 61/846,268, filed on Jul. 15, 2013.

(51) Int. Cl.
*H05K 1/11* (2006.01)
*H05K 1/02* (2006.01)
*H05K 3/46* (2006.01)

(52) U.S. Cl.
CPC ........... *H05K 1/116* (2013.01); *H05K 1/0222* (2013.01); *H05K 3/4685* (2013.01); *H05K 2201/0959* (2013.01); *H05K 2201/09745* (2013.01); *Y10T 29/49123* (2015.01)

(58) Field of Classification Search
CPC .......... H05K 1/0228; H05K 1/11; H01K 3/10; H01L 2924/01079
USPC .......................... 361/792; 174/266; 257/698
See application file for complete search history.

(56) References Cited

U.S. PATENT DOCUMENTS

| 5,949,030 A | 9/1999 | Fasano et al. | |
| 7,404,250 B2* | 7/2008 | Cheng et al. | 29/852 |
| 8,502,085 B2* | 8/2013 | Kim | H05K 1/0219 174/262 |

(Continued)

OTHER PUBLICATIONS

IEEE 2005 Electronic Components and Technology Conference, 2005, pp. 1378-1382, "A New Via Hole Structure of MLB (Multi-Layered Printed Circuit Board) for RF and High Speed Systems", Kim, et al.
IEEE Transactions on Components and Packaging Technologies, vol. 26, No. 2, Jun. 2003, pp. 483-489, "Characterization and Modeling of a New Via Structure in Multilayered Printed Circuit Boards", Kwon, et al.

(Continued)

*Primary Examiner* — Hoa C Nguyen
*Assistant Examiner* — Stanley Tso
(74) *Attorney, Agent, or Firm* — Nields, Lemack & Frame, LLC

(57) ABSTRACT

A printed circuit board, and a method of fabricating the printed circuit board is disclosed. The printed circuit board includes at least one coaxial via. A hollow via is disposed in the printed circuit board. A metal sleeve is formed around the circumference of said hollow via. An inner conductive path is disposed in the hollow via. Additionally, an insulating material is disposed in the hollow via, between the conducting path and the metal sleeve. The conductive path is used to connect signal traces disposed on two different layers of the printed circuit board. In some embodiments, these signal traces carry signals having a frequency above 1 GHz, although the disclosure is not limited to this embodiment.

15 Claims, 5 Drawing Sheets

(56) References Cited

U.S. PATENT DOCUMENTS

| | | | |
|---|---|---|---|
| 2005/0247482 A1* | 11/2005 | Nakamura | 174/262 |
| 2006/0044083 A1 | 3/2006 | Kuzmenka | |
| 2007/0124930 A1 | 6/2007 | Cheng et al. | |
| 2007/0194431 A1* | 8/2007 | Corisis | H01L 23/66 257/698 |
| 2009/0294167 A1* | 12/2009 | Nomiya | H05K 1/0271 174/264 |
| 2010/0195301 A1 | 8/2010 | Fotherby | |
| 2011/0203842 A1 | 8/2011 | Russell | |
| 2012/0175782 A1* | 7/2012 | Im | H01L 23/49822 257/774 |
| 2014/0318847 A1* | 10/2014 | Otsubo | H01L 23/49827 174/262 |

OTHER PUBLICATIONS

Proceedings of the 37th European Microwave Conference, Oct. 2007, Munich, Germany, pp. 134-137, "Design and Optimization of Coax-to-Microstrip Transition and Through-Hole Signal Via on Multilayer Printed Circuit Boards", Nath, et al.

IEEE Transactions on Microwave Theory and Techniques, vol. 45, No. 10, Oct. 1997, pp. 1981-1985, "Coax Via—A Technique to Reduce Crosstalk and Enhance Impedance Match at Vias in High-Frequency Multilayer Packages Verified by FDTD and MoM Modeling", Pillai.

International Search Report and Written Opinion mailed Dec. 16, 2014 in corresponding PCT application No. PCT/US14/46211.

* cited by examiner

SLEEVED COAXIAL PRINTED CIRCUIT BOARD VIAS

This application claims priority to U.S. Provisional Application Ser. No. 61/846,268, filed Jul. 15, 2013, the disclosure of which is incorporated herein by reference in its entirety.

This invention was made with U.S. Government support under Contract No. Fa8721-05-0002, awarded by the United States Air Force. The government may have certain rights in the invention.

BACKGROUND

Printed circuit boards are used ubiquitously for a wide range of applications. A typical printed circuit board (or PCB) has a top and bottom surface, on which components may be affixed, such as by soldering. Between the top and bottom surfaces are a plurality of layers used to carry signals from one point on the PCB to another point. Each layer is comprised of an insulating material with conductive traces disposed thereon.

Signals can begin on one layer to move to another layer through the use of vias. Vias are conductive pathways that connect signals on various layers together. If the layers of the PCB are defined as being horizontal planes, these vias are typically vertical conductive pathways. In some embodiments, the vias pass through the entirety of the PCB. In other embodiments, known as blind vias, the via is accessible on either the top or bottom surface, but does not pass through the entirety of the PCB. In another embodiment, known as buried vias, the via may connect signals on two interior layers and not be accessible on either outer surface.

Vias have been used successfully for many years to carry signals between layers on printed circuit boards. However, as the frequencies of the signals on these PCBs continue to increase, vias have some limitations. For example, the high frequency signal may emit electromagnetic radiation to the interior layers through which it is passing. Furthermore, the impedance of the via may be different than the impedance of the signal traveling on a particular layer. This difference in impedance may cause undesirable reflections, affecting system performance.

In some implementations, it may be important to have PCBs which display high isolation and low cross talk. Furthermore, it may be important to have high dynamic frequency range electromagnetic transmission. Therefore, an improved PCB and a method of manufacturing such a PCB may be beneficial.

SUMMARY

A printed circuit board, and a method of fabricating the printed circuit board is disclosed. The printed circuit board includes at least one coaxial via. A hollow via is disposed in the printed circuit board. A metal sleeve is formed around the circumference of the hollow via. An insulating material is disposed in the hollow via, between a conducting path and the metal sleeve. The conductive path is disposed in the insulating material and is used to connect signal traces disposed on two different layers of the printed circuit board. In some embodiments, these signal traces carry signals having a frequency above 1 GHz, although the disclosure is not limited to this embodiment.

In one embodiment, a printed circuit board is disclosed. The printed circuit board comprises a plurality of layers, stacked on top of one another, comprising two outer layers and at least one interior layer disposed between said outer layers; a via passing through at least two of the layers; wherein the via comprises an annular metal sleeve disposed around an inner circumference of the via; a conductive path in the via connecting a first signal trace on a first layer of the plurality of layers to a second signal trace disposed on a second layer of the plurality of layers; and an insulating material disposed in the via between the annular metal sleeve and the conductive path. In a further embodiment, the annular metal sleeve is notched to allow the first signal trace and the second signal trace to electrically connect to the conductive path without contacting the annular metal sleeve.

In another embodiment, a method of manufacturing a sleeved coaxial via in a printed circuit board is disclosed. The method comprises affixing a plurality of layers together, one on top of another; drilling a first hole through the plurality of layers; plating an inner circumference of the first hole with a conductive material to create a metal sleeve; depositing an insulating material in the first hole after plating; drilling a second hole through the insulating material; inserting a conductive material in the second hole to form a conductive path; and electrically connecting a signal trace on an outer layer of the printed circuit board to the conductive path.

In another embodiment, a printed circuit board is disclosed. The printed circuit board comprises a plurality of layers, stacked on top of one another, comprising a top surface, a bottom surface and at least one interior ground layer disposed between the top and bottom surfaces; a first signal trace disposed on the top surface; a second signal trace disposed on the bottom surface and a via passing through the plurality of layers, wherein the via comprises an annular metal sleeve disposed around an inner circumference of the via, and in electrical communication with one of the at least one interior ground layer so as to ground the metal sleeve; a conductive path disposed in the via electrically connecting the first signal trace on the top surface to the second signal trace disposed on the bottom surface; and an insulating material disposed in the via between the annular metal sleeve and the conductive path.

BRIEF DESCRIPTION OF THE DRAWINGS

For a better understanding of the present disclosure, reference is made to the accompanying drawings, which are incorporated herein by reference and in which.

DETAILED DESCRIPTION OF THE INVENTION

While this disclosure relates to sleeved coaxial vias for use with high frequency signals, it is understood that the printed circuit board (PCB) and methods described herein may have broader utility and may be used with signals of any frequency. Therefore, the disclosure is not limited to a particular embodiment.

Figure 1:
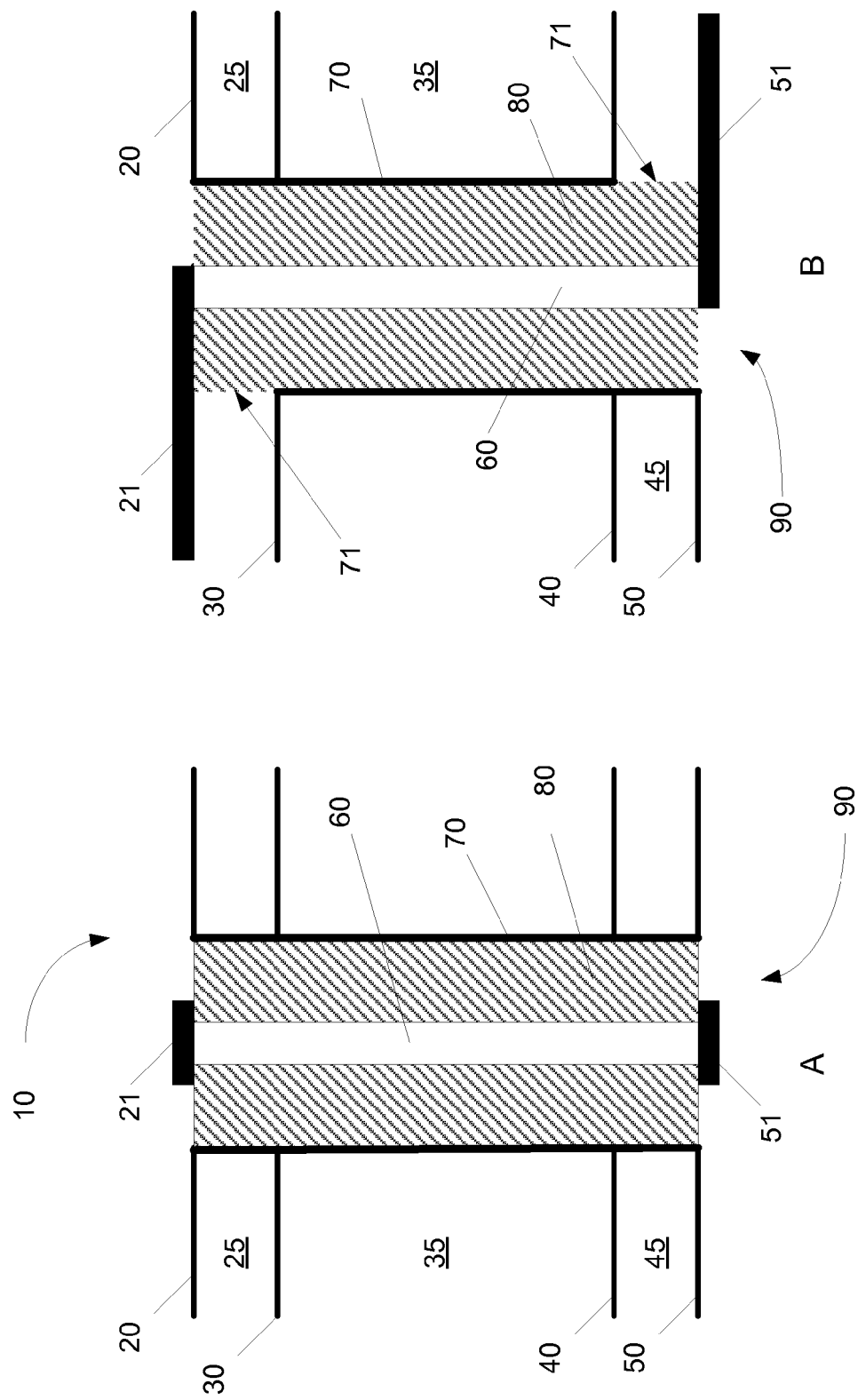
FIGS. 1A-B shows cross-sectional views of a first embodiment.

FIGS. 1A-B show cross-sectional views of a PCB according to a first embodiment. In this embodiment, the PCB 10, includes four distinct layers stacked on top of one another; top surface 20, a first interior layer 30, a second interior layer 40 and a bottom surface 50. These various layers may have different functions. For example, some layers may be signal layers. Conductive traces are disposed on signal layers to route signals across the PCB 10. Some layers may be ground layers, which as the name suggests, are conductive layers which are electrically connected to ground. Other layers may be power layers, which are conductive layers that are electrically connected to one or more voltage sources. While only four layers are shown, the disclosure is not limited to this configuration. In fact, any number of signal and ground layers may be included in the PCB 10. In some embodiments, one or more power layers may also be included in the PCB 10. In this particular embodiment, the top surface 20 may be a first signal layer, while the bottom surface 50 may be a second signal layer 50. Again, any number of layers may be disposed between the top and bottom surfaces 20, 50. For example, the interior layers 30, 40 may also comprise one or more signal layers. However, in this embodiment, one or both of the first and second interior layers 30, 40 may be ground layers.

The various layers 20-50 may be separated by different materials. For example, the top surface 20 and the first interior layer 30 may be separated by a laminate material 25, suitable for high frequency signals. One such material may be RO4350®, available from Rogers Corporation. The thickness of this laminate material 25 may be about 10 mils, although other thicknesses are within the scope of the disclosure. The material used may be designed for RF applications and have a fairly low dielectric constant and low loss tangent. Many materials having similar characteristics may be used. In one embodiment, a particular material is used due to its performance, cost and its dielectric constant. For example, the material described above, has a dielectric constant that is close to that of the filler material 80 used in the via 90, as described in more detail below.

Ground and power layers are typically comprised of copper, such as 0.5 ounce copper. Other copper thicknesses may be used, based on acceptable electrical and mechanical performance. The first interior layer 30 and the second interior layer 40 may be separated by a dielectric material 35. In some embodiments, RF signals are not carried on one or more of the interior layers 30, 40. In these embodiments, the RF signals on the top and bottom surfaces 20, 50, may not be coupled to or influenced by this dielectric material 35 used in the interior layers 30, 40. In these embodiments, a low cost material, such as FR4, which is commonly used for PCBs, may be used to separate the interior layers 30, 40. However, other materials may also be used to separate the interior layers 30, 40. For example, in one embodiment, RO4350® may be used to separate the interior layers 30, 40 as well. This dielectric material 35 may be about 50 mils thick, although other thicknesses are also within the scope of the disclosure.

The second interior layer 40 and the bottom surface 50 may be separated by a laminate material 45, similar to that used between the top surface 20 and the first interior layer 30.

Many different laminate material types may be used to separate the various layers. In some embodiments, the laminate material 45 may be the same as the dielectric material 35 for material uniformity. However, in other embodiments, different materials may be used, based on the electrical and mechanical performance requirements, cost, and availability. For example, the material used between adjacent layers that do not carry high frequency signals may be lower cost filler materials, as described above.

A via 90 is used to create an opening through two or more layers of the PCB 10. Via 90 is a hollow passageway between two or more layers. In some embodiments, via 90 is a hollow cylindrical passageway between a plurality of layers. A conductive path 60 is disposed within the via 90 and is used to connect a trace 21 on the top surface 20 to a trace 51 on the bottom surface 50. In other embodiments, the conductive path 60 may be used to connect a signal trace on one layer to a second signal trace disposed on a different layer, where one or both of these layers are interior layers. As seen in FIG. 1A, the via 90 passes through the different materials, such as the laminate material 25, 45 and the dielectric material 35. In traditional PCBs, these different materials cause impedance discontinuities, which may affect signal integrity.

In the embodiment of FIG. 1A-B, a metal sleeve 70 is disposed along the inner circumference of the via 90. This metal sleeve 70 is in electrical communication with one or more of the interior layers 30, 40. For example, the metal sleeve 70 may be in electrical communication with one or more ground layers. In another embodiment, the metal sleeve may be in electrical communication with one or more power layers. A filler material 80 is disposed between the conductive path 60 and the metal sleeve 70. The metal sleeve 70 isolates the signal carried by the conductive path 60 from the various layers and serves to minimize cross talk.

The filler material 80 may be selected to have a dielectric constant similar to that of the laminate material 25,45. In other embodiments, the dielectric constant of the laminate material 25 may not match that of the filler material 80. In these embodiments, the thickness of the laminate material 25 can be different from that disclosed above, as long as the material dielectric constant and trace width are calculated for the desired characteristic impedance.

FIG. 1A shows a cross-sectional view where the trace on the top surface 20 and the trace 51 on the bottom surface 50 are travelling perpendicular to the plane of the page. It should be noted that the signal trace 21 is actually of the same thickness as the top surface 20. The thickness of the signal trace 21 is exaggerated in this figure to better clarify the presence and position of the trace 21. The same applies to signal trace 51 with respect to bottom surface 50. FIG. 1B shows a cross-section view where the trace 21 on the top surface 20 and the trace 51 on the bottom surface 50 travel parallel to the plane of the page. In this view, the trace 21 travels from the left side on the top surface 20, through the via 90 and exits to the right on a trace 51 on the bottom surface 50.

Figure 2:
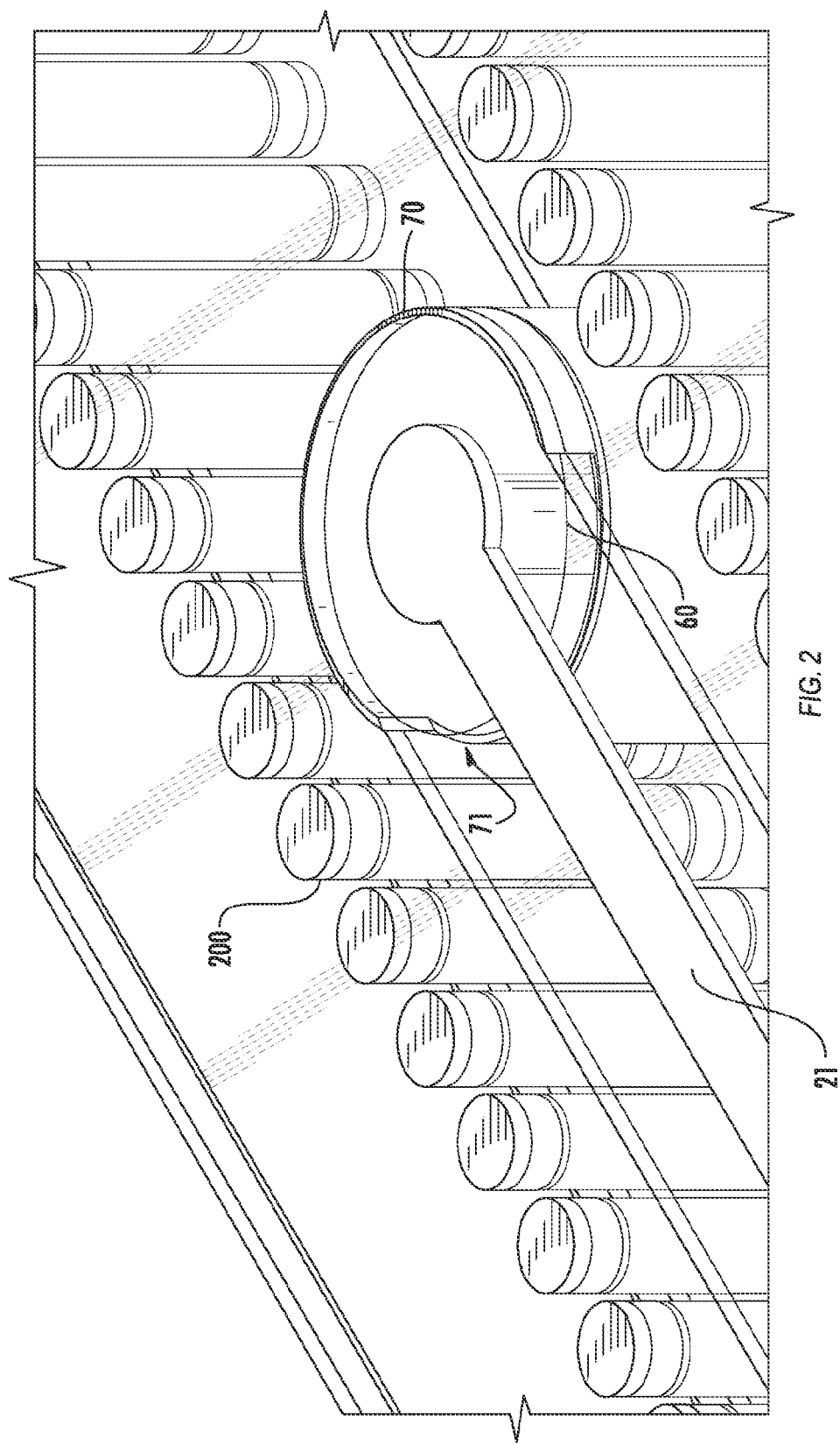
FIG. 2 shows a perspective view of the embodiment of FIG. 1.

Since the signal traces must reach the conductive path 60, it may be necessary to remove a portion of the metal sleeve 70 near the top surface 20 and near the bottom surface 50. In other words, the metal sleeve 70 extends through the entirety of the PCB 10, except notches 71 are made in the metal sleeve 70 to allow the traces 21, 51 to contact the conductive path 60. This is best seen in FIG. 1B and FIG. 2.

Figure 3:
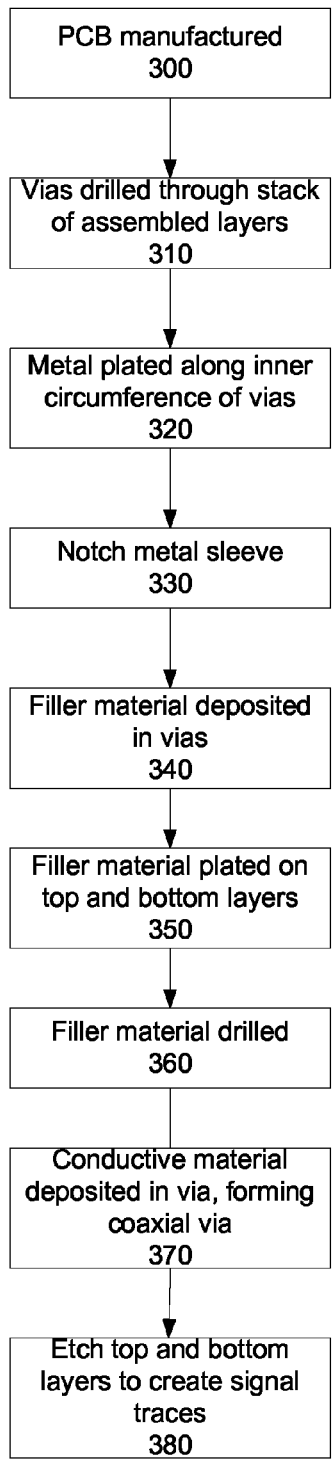
FIG. 3 is a flowchart showing a first embodiment of a process used to manufacture the sleeved coaxial via in the PCB of FIG. 1.

FIG. 3 shows a flowchart illustrating a first embodiment of a manufacturing process that can be used to make the PCB of FIG. 1A-B. First, as shown in Step 300, the PCB 10 is manufactured in accordance with previously known techniques. For example, a plurality of individual layers are fabricated, and then precisely stacked on one another to form an assembly, such that features and pads on one layer align with corresponding features and pads on an adjacent layer. In this embodiment, the top and bottom layers 20, 50 may be plated with copper, but the various signal traces on these layers 20, 50 have yet to be etched.

After the plurality of layers are stacked and affixed on top of each other, the vias 90 are drilled through the stack of layered assembly, as shown in step 310.

The diameter of the via 90 is set to a calculated inner to outer via size ratio, where this via size ratio is the ratio of the inner diameter of the via 90 to the diameter of the conductive path 60. This via size ratio is specific to the material dielectric constant and the desired characteristic impedance. For instance, if the traces 21, 51 are 50 ohms, then a 50 ohm sleeved coaxial via may be needed to match the impedances.

Another factor in setting the inner diameter of the via 90 is the material thickness. As an example, a comfortable material depth to drill size ratio of 12:1 is commonly used as a minimum hole size. So, for a material having a thickness of 120 mils, the minimum suggested hole diameter may be 10 mils. It is important to note that different processes may have different drill ratio limits. Some may be as high as or exceed 30:1.

The diameter of the outer metal sleeve can vary, thereby changing its characteristic impedance from that of the signal trace 21, 51 in some embodiments. For example, in some cases, impedance transformation from one trace layer to another may be needed. When tuning an antenna or other EM structure or device, the coaxial sleeve can create a different impedance other than the trace or antenna characteristic impedance. This coaxial sleeve may help tune in the antenna or circuit as part of a tuning or matching network. This is added area for RF tuning for an antenna or other device.

In step 320, a conductive material is plated along the inner circumference of the via 90, without filling the entirety of the via. This conductive material, which is typically a metal, such as copper, may be referred to as a sleeve or a metal sleeve 70. The PCB 10 may be manufactured such that the conductive material contacts at least one of the interior layers 30, 40, thereby electrically connecting the conductive material of the metal sleeve 70 to this interior layer 30, 40. As described above, this interior layer 30, 40 may be one or more ground layers.

In another embodiment, rather than plating along the inner circumference of the via 90, the conductive material is introduced to the inner circumference of the via 90 in a different manner. In other words, alternative methods of creating a via 90 with a conductive material disposed along the inner circumference of the via are also envisioned.

As described above, a portion of the metal sleeve 70 may need to be notched to allow the signal traces 21, 51 to connect to the conductive path 60. The metal sleeve 70 may be notched in step 330. This may be performed using a machining step. In other embodiments, a chemical, mechanical or electrical material removal process or a selective material removal process may be used to create the notch. For example, in one alternate embodiment, a laser may be used to create the notch.

While FIGS. 1B and 2 show that only a portion of the metal sleeve 70 is notched, other embodiments are also possible. For example, in some embodiments, the entire circumference of the metal sleeve 70 is notched. In this way, the metal sleeve 70 does not extend all the way to the top surface 20 and bottom surface 50. Thus, the metal sleeve 70 may terminate before reaching the outer surfaces. Other techniques, such as grounding vias may be used as well.

Note that step 330 may be performed at any time after step 320, and need not be before the other steps are completed. For example, in other embodiments, the filler material 80 may be deposited in step 340 prior to the notching. This may add more structural support during the notching operation. In this case, more filler material 80 would need to be deposited after the notching process 330 is completed.

A filler material 80 is then deposited in the via 90 after the metal sleeve is created, as shown in step 340. This filler material 80 may be an epoxy filler, as described above.

After the filler material 80 has been added, it may be planarized so that it is at the same level (or slightly below) as the top surface 20 and bottom surface 50. The exposed areas of the filler material 80 may then be plated, as shown in step 350, so that the top surface 20 and bottom surface 50, including the exposed filler material 80, is entirely plated with copper. Stated differently, the entirety of the top and bottom surfaces 20, 50 are plated across the entirety of their respective surfaces in a planar fashion.

As shown in step 360, the center of the filler material 80 is then drilled from the top surface 20 to the bottom surface 50. The filler material 80 is drilled through its center. In other words, the via 90 and the hole drilled through the filler material 80 have a common center and are concentric.

After the hole is drilled, a conductive material 60 is deposited throughout the hole, as shown in step 370, thereby electrically connecting the plating disposed on the top surface 20 with the plating disposed on the bottom surface 50. This serves to create the desired coaxial via, where there is an inner conductor 60, surrounded by an insulating filler material 80, which is, in turn, surrounded by a metal sleeve 70.

Finally, as shown in step 380, the top surface 20 and the bottom surface 50 are etched to create the signal traces 21, 51, respectively, that are disposed on each of these layers.

Figure 4:
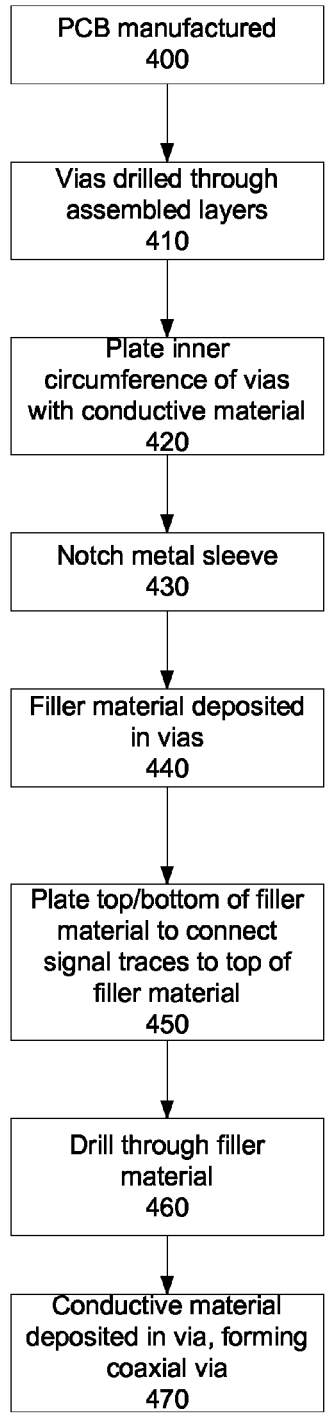
FIG. 4 is a flowchart showing a second embodiment of a process used to manufacture the sleeved coaxial via in the PCB of FIG. 1.

FIG. 4 shows a flowchart illustrating a second embodiment of a manufacturing process that can be used to make the PCB of FIG. 1A-B. First, as shown in Step 400, the PCB 10 is manufactured in accordance with previously known techniques. For example, a plurality of individual layers are fabricated, and then precisely stacked on one another to form an assembly, such that features and pads on one layer align with corresponding features and pads on an adjacent layer. In this embodiment, unlike that of FIG. 3, the signal traces have already been etched on the top surface 20 and the bottom surface 50.

Next, as shown in step 410, the vias are drilled through the stacked assembly. The dimensions of the vias may be determined as described above with respect to step 310. In step 420, the inner circumference of the vias are then plated with a conductive material creating the metal sleeve 70, as was described with respect to step 320. In step 430, the metal sleeve 70 is then notched as described above with respect to step 330.

A filler material 80 is then deposited in the via 90, as shown in step 440. This filler material 80 may be an epoxy filler, as described above.

In some embodiments, the outer surfaces of the filler material 80 are planarized so that the filler material is at the same level (or slightly below) as the top and bottom surfaces 20, 50. This may be done in any known manner and is performed after the filler material 80 has been deposited in step 440.

The exposed filler material 80 on the top and bottom surfaces 20, 50 is then plated, as shown in step 450. This plating may serve to cover the filler material 80 (as was done in FIG. 3). However, in this embodiment, the plating also serves to connect the signal traces 21, 51 that have already been etched on the top and bottom surfaces 20, 50 to the areas above the filler material 80. It is important that this plating does not contact the metal sleeve 70, as this would short the metal sleeve 70 and the signal traces together. In some embodiments, the metal sleeve 70 may not extend all the way to the top and bottom surfaces 20, 50, thereby avoiding this possibility.

After the filler material 80 has been deposited in the vias 90 and then surface plated, it is then drilled as shown in step 460. This creates a second annular ring comprised of the filler material 80. The metal sleeve 70 and the second annular ring are preferably concentric.

After the drilling, a conductive material is deposited in the inner hole, as shown in step 470. This conductive material may be copper. Thus, after the completion of step 470, a sleeved coaxial via has been created, where there is an outer metal sleeve 70, which is preferably grounded, an insulating material 80 and an inner conductive path 60.

As described above, a portion of the metal sleeve 70 may need to be notched to allow the signal traces 21 to connect to the conductive path 60. The metal sleeve 70 may be notched in step 430. This may be performed using a machining step. In other embodiments, a chemical, mechanical or electrical material removal process or a selective material removal process may be used to create the notch. Note that step 430 may be performed at any time after step 420, and need not be after the other steps are completed. For example, the notch may be created after step 420, as shown in FIG. 4. However, in other embodiments, the filler material may be deposited in step 440 prior to the notching. This may add more structural support during the notching operation. In this case, more filler material 80 would need to be deposited after the notching process 440 is completed.

In some embodiments, it may be desirable that the impedance of this coaxial via match the impedance of the laminate material 25, 45 in which the signal traces 21, 51 are carried. This may be accomplished in a number of ways. First, the characteristic impedance of a coaxial via is related to the dielectric constant of the filler material 80 and the ratio of the diameter of the metal sleeve 70 to the diameter of the conductive path 60. Thus, by varying the dielectric constant of the insulating material 80, any desired impedance can be achieved. Alternatively, the diameter of the via 90 may be varied to achieve the desired impedance. Finally, the diameter of the conductive path 60 may also be varied. In some embodiments, more than one of these parameters is tuned to achieve the desired impedance.

Additional features may be incorporated in the PCB 10 to further reduce cross talk. For example, FIG. 2 shows a perspective view of the top surface of PCB 10. In FIG. 2, a plurality of grounded vias 200 is shown on either side of the signal trace 21. These grounded vias 200 may be used to create an enclosure or fence on either side of the high frequency signal trace 21. These grounded vias 200 typically pass through the entirety of the PCB 10, and are typically connected to one or more ground layers. These grounded vias 200 may be fabricated in accordance with commonly used techniques. However, in some embodiments, these additional grounded vias 200 may not be utilized. Further, the exact placement of the grounded vias 200 is not limited by this disclosure.

As described above, FIGS. 1A-B show a four layer PCB. However, the disclosure is not limited to a particular number of layers. Furthermore, FIGS. 1A-B show that the via 90 is used to attach signal trace 21 on one outer layer to signal trace 51 located on the opposite outer layer. However, the via 90 may also be used to connect signal traces which are not disposed on the outer layers. In other embodiments, the via may not pass from the top outer layer directly to the bottom outer layer.

Figure 5:
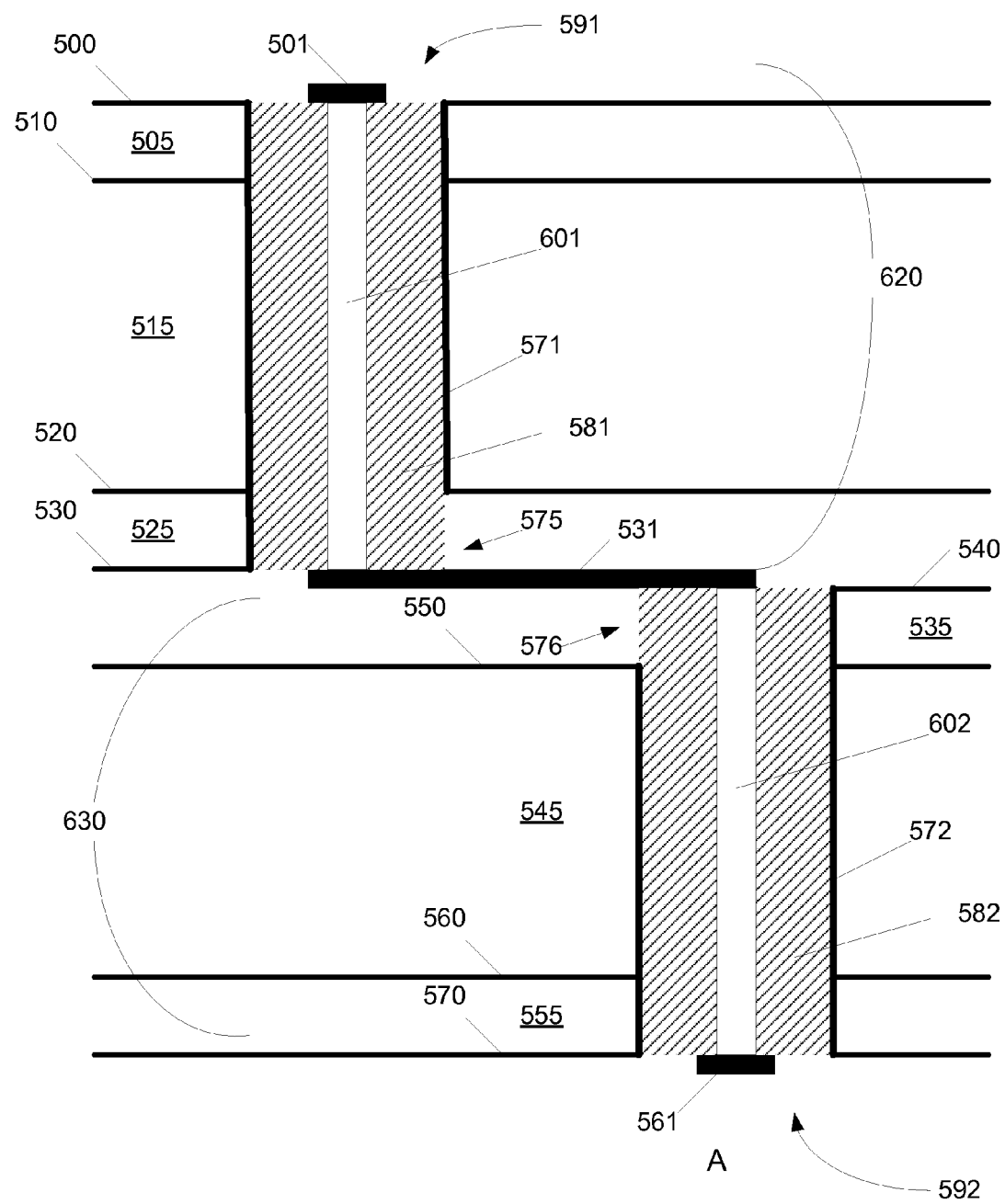
FIG. 5 shows a cross-sectional view of a second embodiment of the printed circuit board.

FIG. 5 shows an embodiment where a signal trace 501 on the first layer 500 is connected to a second signal trace 561, disposed on the bottom layer 570. However, in this embodiment, the via is comprised of two portions, a first portion 591, which extends from the first layer 500 to an interior layer 530, and a second portion 592, which extends from the interior layer 540 to the bottom layer 570.

As was described above, the first portion 591 of the via includes a first metal sleeve 571, a first insulating material 581, and a first conductive path 601. Likewise, the second portion 592 of the via includes a second metal sleeve 572, a second insulating material 582, and a second conductive path 602. Furthermore, the PCB may be comprised of a plurality of layers 500, 510, 520, 530, 540, 550, 560, 570, each of which is separated from the adjacent materials by a laminate or dielectric material 505, 515, 525, 535, 545, 555. However, the PCB is not limited to any particular number of layers.

An interior signal trace 531 is used to connect the first conductive path 601 to the second conductive path 602. It should be noted that the signal trace 531 is actually of the same thickness as layer 530. The thickness of the signal trace 531 is exaggerated in this figure to better clarify the presence and position of the trace 531. This may be achieved by forming the PCB as two separate assemblies, using the technique described in FIG. 3 or FIG. 4.

Specifically, the first assembly 620 comprises layers 500, 510, 520, 530 and laminate or dielectric materials 505, 515, 525. This first assembly 620 also includes the first portion 591 of the via. Note that since signal trace 531 exits from the first portion 591 and travels to the right, a notch 575 is created in the first metal sleeve 571, as described above. Thus, the first assembly 620 can be fabricated exactly as described in FIG. 3 or in FIG. 4. When completed, the first assembly 620 has signal traces etched on top surface 500 and bottom surface 530. Signal trace 531 extends from the first portion 591 of the via and may terminate in a pad, which is disposed at a location aligned with the second portion 592 of the via.

Similarly, a second assembly 630 is fabricated which includes layers 540, 550, 560, 570 and laminate or dielectric materials 535, 545, 555. In addition, the second portion 592 of the via is disposed in the second assembly 630. Like the first assembly, a notch 576 may be created in the second metal sleeve 572. This notch 576 is needed to prevent the signal trace 531 from contacting the metal sleeve 572. However, unlike the first assembly 620, the top layer 540 of the second assembly 620 may not contain any traces. When the two assemblies 620, 630 are stacked together, layers 530, 540 will be adjacent to one another. Therefore, one of these two layers 530, 540 may not have any signal traces. Therefore, in one embodiment, some or all of the plating on the layer 540 is removed, except in those locations where the first assembly 620 is to connect to the second assembly 630. For example, in FIG. 5, the layer 540 may have no copper plating, except on top of second portion 592 of the via.

The above description describes an embodiment where the first assembly 620 is fabricated with traces etched on both the top and bottom layers 500, 530, while there are no signal traces etched into the top layer 540 of the second assembly 630. Of course, those skilled in the art will appreciate that other embodiments are possible. For example, traces may be etched on layer 540, while the plating may be removed from layer 530. Thus, in some embodiments, only one of layers 530, 540 has traces, while the other layer only has plating where the two assemblies 620, 630 are to electrically connect.

Thus, in this embodiment, the first assembly 620 has traces on layer 530, including trace 531, which terminates in a pad disposed directly above the second portion 592 of the via. The second assembly 630 has no traces or plating on layer 540, with the exception of those locations where the first assembly 620 connects the second assembly 630. Thus, in FIG. 5, there is plating on top of the second portion 592 of the via on layer 540, while no other plating is disposed on layer 540.

After both assemblies 620, 630 have been fabricated, they are bonded together to form a single PCB. In one embodiment, this is done through the use of a non-conductive bonding agent and a conductive bonding agent. Specifically, the conductive bonding agent is applied to any location where a trace or pad from layer 530 must connect with a pad from layer 540. The non-conductive bonding agent, which may be a prepreg material, is applied to all other areas. In some embodiments, the conductive bonding agent may be deposited onto the surfaces of one or both of the assemblies 620, 630. After the two bonding agents are applied, the two assemblies 620, 630 are pressed together. The conductive bonding agent hardens to form a conductive path between layer 530 and layer 540. The non-conductive bonding agent insures the structural integrity of the completed PCB.

Stated differently, the PCB of FIG. 5 may be manufactured as two assemblies 620, 630 which are later joined together. Each assembly can be manufactured in accordance with the process shown in FIG. 3 or FIG. 4. After the two assemblies 620, 630 has been completed, they can be joined together. As stated above, a conductive bonding agent may be applied to each location on the bottom surface 530 of the first assembly 620 that is to contact a location of the top surface 540 of the second assembly 630. Alternatively, the conductive bonding agent may be applied to the top surface 540 of the second assembly 630, or to both assemblies 620, 630. The non-conductive bonding agent may be applied to all other areas where electrical contact is not required. After this, the two assemblies 620, 630 are pressed together using typical bonding fabrication processing techniques to form a single PCB having a non-continuous via.

In some embodiments, a coaxial via may only pass through a portion of the layers of the PCB. For example, the coaxial via may only be in the assembly 620 (see FIG. 5). In this embodiment, the first assembly 620 is processed as described in FIG. 3 or FIG. 4. However, there is no need to electrically connect a trace 531 from the first conductive path 601 to the second conductive path 602 using conductive bonding agent. Rather, the trace 531 is used on interior layer 530.

In yet another embodiment, the coaxial via may not be extend to either of the outer layers of the PCB. This PCB can be constructed by creating a subassembly (also referred to as a sub-laminate) which includes only those layers where the via is to be disposed. This subassembly is manufactured as described above. Additional layers or subassemblies can be affixed to this subassembly using a bonding agent, as described above. This via may be referred to as a buried via.

While particular embodiments of the invention have been shown and described, it will be obvious to those skilled in the art that various changes and modifications may be made without departing from the present invention in its broader aspects. It is intended that all matter contained in the above description and shown in the accompanying drawings shall be interpreted as illustrative and not in a limiting sense.

What is claimed is:

1. A printed circuit board,
comprising: a plurality of layers, stacked on top of one another,
comprising two outer layers and at least one interior ground layer disposed between said outer layers;
and a via passing through at least two of said layers,
wherein said via comprises: an annular metal sleeve disposed around an inner circumference of said via;
a conductive path disposed in said via connecting a first signal trace on a first layer of said plurality of layers to a second signal trace disposed on a second layer of said plurality of layers;
and an insulating material disposed in said via between said annular metal sleeve and said conductive path,
wherein said annular metal sleeve extends from said first layer to said second layer,
is in physical contact with and is electrically connected to said at least one interior ground layer,
and comprises a first notch, disposed near said first layer, to allow said first signal trace to connect to said conductive path
and a second notch, disposed near said second layer, to allow said second signal trace to connect to said conductive path,
and wherein a ratio of a diameter of the annular metal sleeve to a diameter of the conductive path and a dielectric constant of the insulating material define an impedance of the via and are dimensioned such that the impedance of the via matches an impedance of the first and second signal traces.

2. The printed circuit board of claim 1, wherein at least one of said first layer and said second layer is an interior layer.

3. The printed circuit board of claim 1, wherein at least one of said first layer and said second layer is an outer layer.

4. The printed circuit board of claim 1, wherein said via passes through all of said plurality of layers.

5. The printed circuit board of claim 1, wherein said second layer is an interior layer, further comprising a second via, not aligned with said via, passing from said second layer to a third layer, different than said first layer, said second via comprising:
a second annular metal sleeve disposed around an inner circumference of said second via;
a second conductive path disposed in said via connecting said second signal trace on said second layer of said plurality of layers to a third signal trace disposed on said third layer of said plurality of layers; and
an insulating material disposed in said second via between said second annular metal sleeve and said second conductive path,
wherein said second annular metal sleeve extends from said second layer to said third layer, is in physical contact with and is electrically connected to an interior ground layer disposed between the second layer and third layer, and comprises a third notch, disposed near said second layer, to allow said second signal trace to connect to said second conductive path and a fourth notch, disposed near said third layer, to allow said third signal trace to connect to said second conductive path.

6. The printed circuit board of claim 5, wherein said first layer and said third layer are outer layers.

7. The printed circuit board of claim 5, wherein said first layer is an outer layer and said third layer is an interior layer.

8. The printed circuit board of claim 1, wherein said conductive path is held in place within said annular metal sleeve by said insulating material.

9. The printed circuit board of claim 1, wherein said conductive path comprises a conductive material deposited throughout a hole formed in said insulating material and disposed at a center of said via.

10. The printed circuit board of claim 1, wherein said annular metal sleeve is plated along said inner circumference so as to contact said one of said at least one interior ground layer along an entirety of said inner circumference.

11. A printed circuit board,
comprising: a plurality of layers, stacked on top of one another,
comprising a top surface, a bottom surface and at least one interior ground layer disposed between said top and bottom surfaces;
a first signal trace disposed on said top surface;
a second signal trace disposed on said bottom surface and a via passing through said plurality of layers,
wherein said via comprises: an annular metal sleeve disposed around an inner circumference of said via,
extending from said top surface to said bottom surface and in physical contact and electrical communication with one of said at least one interior ground layer so as to ground said metal sleeve;
a conductive path disposed in said via electrically connecting said first signal trace on said top surface to said second signal trace disposed on said bottom surface;
and an insulating material disposed in said via between said annular metal sleeve and said conductive path,
wherein said annular metal sleeve comprises a first notch, disposed near said top surface, to allow said first signal trace to connect to said conductive path and a second notch, disposed near said bottom surface, to allow said second signal trace to connect to said conductive path,
and wherein a ratio of a diameter of the annular metal sleeve to a diameter of the conductive path and a dielectric constant of the insulating material define an impedance of the via and are dimensioned such that the impedance of the via matches an impedance of the first and second signal traces.

12. The printed circuit board of claim 11, wherein said annular metal sleeve is in electrical communication with ground on said top surface and said bottom surface.

13. The printed circuit board of claim 11, wherein said conductive path is held in place within said annular metal sleeve by said insulating material.

14. The printed circuit board of claim 11, wherein said conductive path comprises a conductive material deposited throughout a hole formed in said insulating material and disposed at a center of said via.

15. The printed circuit board of claim 11, wherein said annular metal sleeve is plated along said inner circumference so as to contact said one of said at least one interior ground layer along an entirety of said inner circumference.

* * * * *

UNITED STATES PATENT AND TRADEMARK OFFICE
CERTIFICATE OF CORRECTION

PATENT NO. : 9,635,761 B2  
APPLICATION NO. : 14/306768  
DATED : April 25, 2017  
INVENTOR(S) : Glenn A. Brigham et al.

Page 1 of 1

It is certified that error appears in the above-identified patent and that said Letters Patent is hereby corrected as shown below:

In the Specification

Lines 7-11, second paragraph after the title, the government support statement please replace:
"This invention was made with U.S. Government support under Contract No. Fa8721-05-0002, awarded by the United States Air Force. The government may have certain rights in the invention."

With:
--This invention was made with Government support under Contract No. FA8721-05-0002, awarded by the U.S. Air Force. The Government has certain rights in the invention.--

Signed and Sealed this  
Twenty-seventh Day of June, 2017

Joseph Matal  
*Performing the Functions and Duties of the  
Under Secretary of Commerce for Intellectual Property and  
Director of the United States Patent and Trademark Office*